(12) United States Patent
Rouchon

(10) Patent No.: US 6,469,898 B1
(45) Date of Patent: Oct. 22, 2002

(54) HEAT DISSIPATING DEVICE

(75) Inventor: Gabriel Rouchon, Long Beach, CA (US)

(73) Assignee: Rouchon Industries Inc., Signal Hills, CA (US)

( * ) Notice: Subject to any disclaimer, the term of this patent is extended or adjusted under 35 U.S.C. 154(b) by 0 days.

(21) Appl. No.: 09/862,761

(22) Filed: May 21, 2001

(51) Int. Cl.[7] .................................................. H05K 7/20
(52) U.S. Cl. ...................... 361/709; 361/695; 361/697; 361/704; 165/80.3; 174/16.1; 174/16.3; 257/722; 257/718; 257/719; 257/727
(58) Field of Search .................................. 361/687, 690, 361/694, 695, 697, 703–705, 709–711, 717–719, 722; 165/80.3, 185; 257/718, 719, 722, 727; 174/16.3; 415/177

(56) References Cited

U.S. PATENT DOCUMENTS

| 5,397,919 A | * | 3/1995 | Tata et al. .................. 257/717 |
| 5,677,829 A | * | 10/1997 | Clemens ..................... 361/697 |
| 5,978,219 A | | 11/1999 | Lin ............................. 361/697 |
| 6,023,413 A | * | 2/2000 | Umezawa ................... 361/697 |
| 6,118,657 A | * | 9/2000 | Clemens ..................... 361/697 |
| 6,173,758 B1 | * | 1/2001 | Ward ......................... 165/80.3 |
| 6,179,046 B1 | | 1/2001 | Hwang et al. ................ 165/80 |

OTHER PUBLICATIONS

Printout from web page www.swiftnets.com dated Mar. 21, 2001.

* cited by examiner

Primary Examiner—Boris Chervinsky
(74) Attorney, Agent, or Firm—Weddey & Patterson; I. C. Weddey, Jr.

(57) ABSTRACT

A heat dissipating device for cooling an electrical component is disclosed that includes a heat sink base. A plurality of helicoid pins is fixed to the heat sink base and extends therefrom. In one preferred embodiment, the helicoid pins have a diameter of about 0.05 inches to 0.15 inches, about 25–35 turns per inch, and a thread depth of about 0.005 and 0.02 inches. The helicoid pins provide an uneven cooling surface and an increased cooling surface area that increase the heat dissipation capability of the heat dissipating device, when compared to straight pins having the same diameter.

13 Claims, 3 Drawing Sheets

HEAT DISSIPATING DEVICE

FIELD OF THE INVENTION

The present invention relates to a heat dissipating device, and more particularly, to a heat dissipating device for dissipating the heat generated by a central processing unit (CPU).

BACKGROUND OF THE INVENTION

With the recent onslaught of improvements in computer technology, the performance of personal computers has become more and more powerful. In order to ensure proper operation of the central processing unit (CPU), the working temperature of the unit must be controlled within a predetermined range. Heat dissipating devices, which are sometimes referred to as heat sinks, are known in the art for accomplishing this objective.

One such prior art heat dissipating device comprises a heat sink base fixed to one side of a microprocessor. A plurality of straight, metal pins extend upwardly from the heat sink base. A cooling fan is positioned at the top of the straight metal pins and forces air downward toward the heat sink base. This prior art heat dissipating device is shown in FIGS. 1–2 of the present disclosure. The fan moves the hot air generated by the microprocessor over the straight metal pins; as the air exits, it helps to maintain the desired working temperature of the central processing unit (CPU).

What is desired therefore is a still more effective heat sink apparatus that provides an increased cooling surface when compared to straight metal pins having the same diameter and that may be manufactured easily and with the use of existing and widely available machinery.

SUMMARY OF THE INVENTION

It is an object of the present invention to provide a heat dissipating device that effectively cools an electrical component, such as a central processing unit (CPU).

It is another object of the present invention to provide a heat dissipating device that cools a CPU more effectively than conventional heat dissipating devices.

It is still a further object of the present invention to provide a heat dissipating device that provides an increased cooling surface when compared to conventional heat dissipating devices.

It is yet a further object of the present invention to provide a heat dissipating device that may be easily manufactured.

It is still a further object of the present invention to provide a heat dissipating device that may be manufactured with the use of existing machinery and without significant retooling.

To overcome the deficiencies of the prior art and to achieve the objects and advantages listed above, a heat dissipating device for cooling a central processing unit is disclosed that comprises: a heat sink base having two sides; and a plurality of helicoid pins having two ends, wherein one end of the helicoid pins is fixed to one side of the heat sink base. The helicoid pins provide an uneven cooling surface. Advantageously, the helicoid pins of the present invention provide an increased cooling surface, when compared to straight pins of the prior art having the same diameter. In one preferred embodiment, the turns of the helicoid pins cause the pins to have a cooling surface at least twice and about three times the cooling surface of a straight pin having the same diameter.

A cooling fan is positioned at the other end of the helicoid pins for moving air about the helicoid pins. Advantageously, the moving air over the uneven cooling surface of the helicoid pins creates a desirable turbulence and facilitates the heat dissipation of the central processing unit by locally accelerating airflow where turbulences occur.

DETAILED DESCRIPTION OF THE PREFERRED EMBODIMENT

Figure 3:
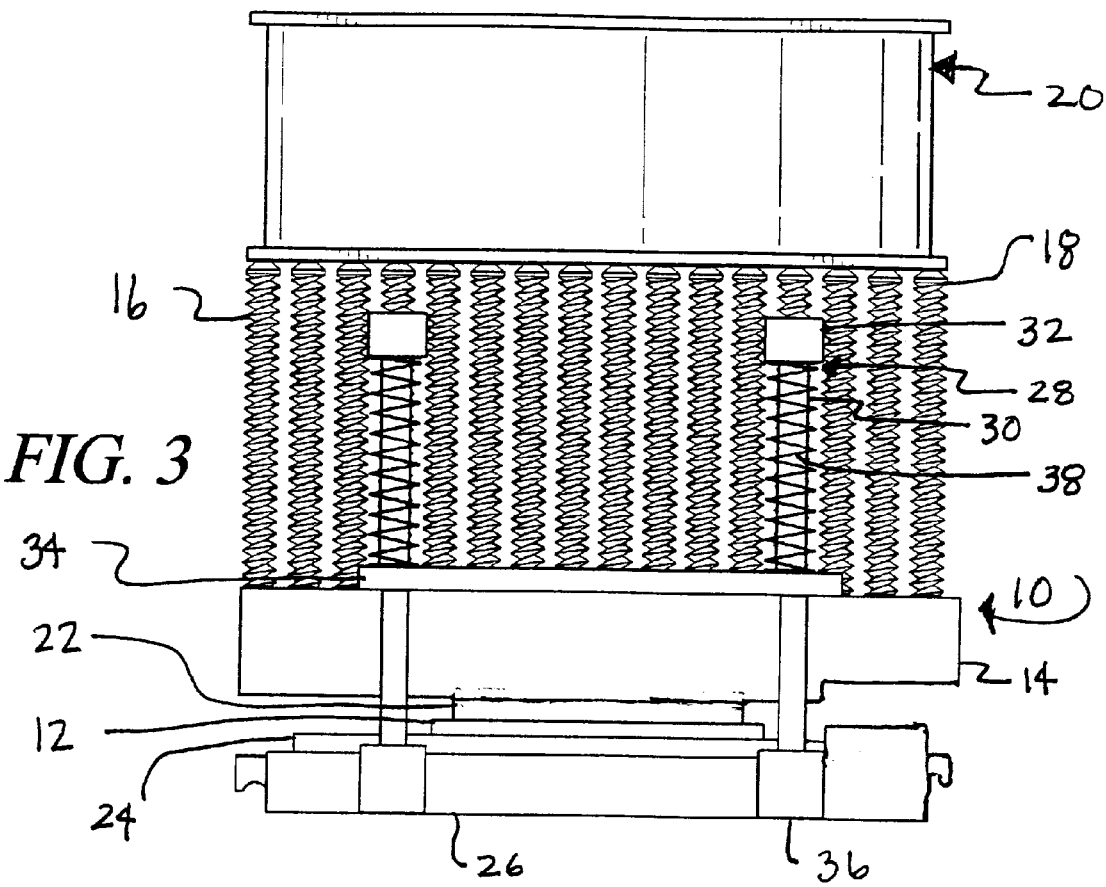
FIG. 3 is a side view of a heat dissipating device comprising multiple helicoid pins constructed in accordance with the present invention.
Figure 4:
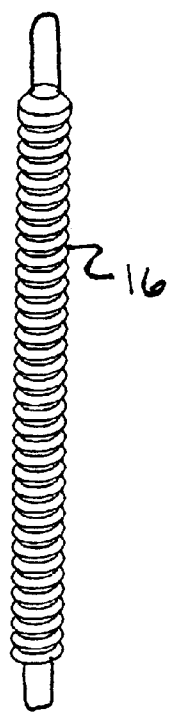
FIG. 4 is an enlarged isometric view of one helicoid pin shown in the heat dissipating device of FIG. 3.

Referring to the drawings in detail, a heat dissipating device, constructed in accordance with the present invention, is shown in FIGS. 3 and 4 and generally designated by the reference numeral 10. It should be noted for the sake of clarity that not all of the components and parts of heat dissipating device 10 are shown or marked in FIGS. 3–4.

The heat dissipating device 10 is suitable for cooling any type of an electrical component, such as a conventional microprocessor 12.

Referring to FIG. 3 in detail, the heat dissipating device 10 comprises a heat sink base 14. As is commonly known in the art, heat sink base 14 consists of a copper or aluminum block that is made by machining in a manner known in the art.

A plurality of helicoid, or threaded, pins, such as 16, 18, are fixed to one side of the heat sink base 14 and extend therefrom. See FIGS. 3, 4. The pins 16, 18 are positioned on the side of the heat sink base opposite the microprocessor 12. The helicoid pins 16, 18 are arranged so that the longitudinal axes (not shown) of each of the pins 16, 18 are substantially parallel to each other.

At least some and preferably all of the helicoid pins 16, 18 have a diameter between about 0.02–0.20 inches, and most preferably 0.05 inches to 0.15 inches. At least some of the helicoid pins have 20–40 turns per inch and most preferably have between about 25–35 turns per inch. Each of the helicoid pins 16, 18 has a thread depth; at least some of the turns and preferably all of them have a thread depth between about 0.005 and 0.02 inches.

Figure 1:
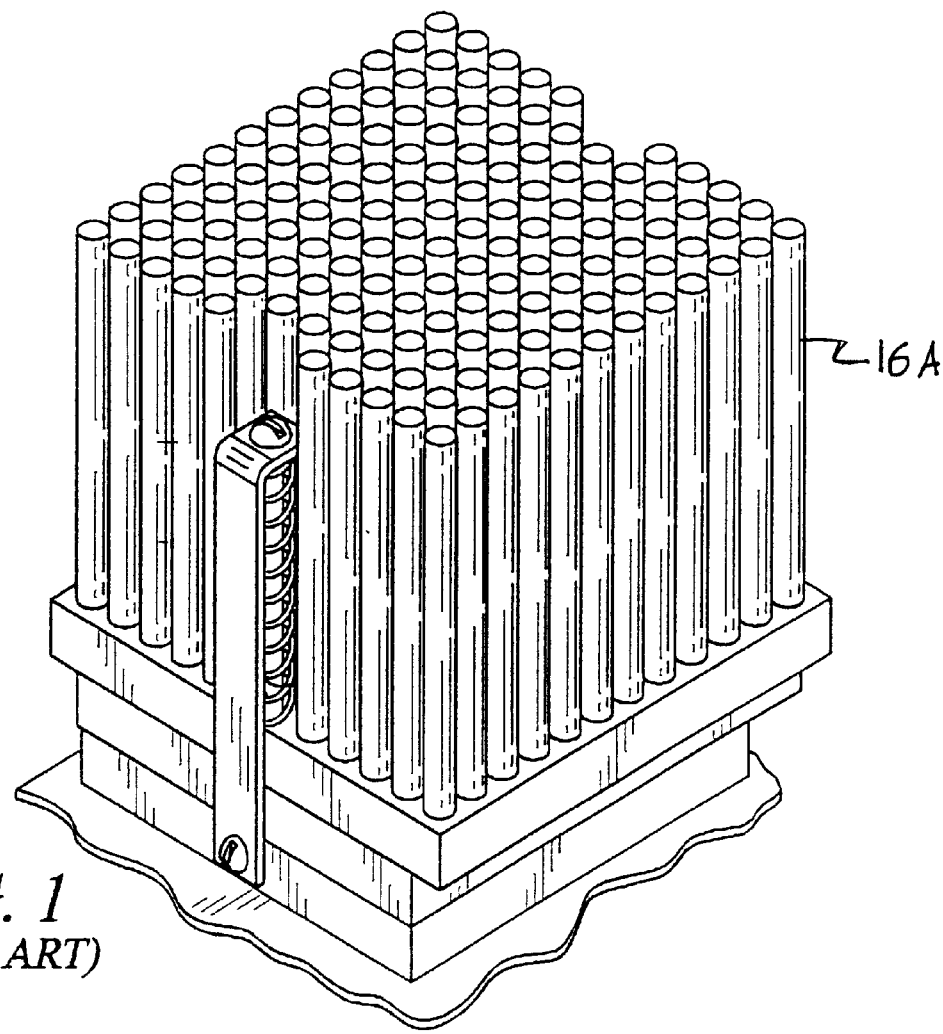
FIG. 1 is an isometric view of a prior art heat dissipating device, illustrating the use of straight metal pins, with portions broken away for the sake of convenience.
Figure 2:
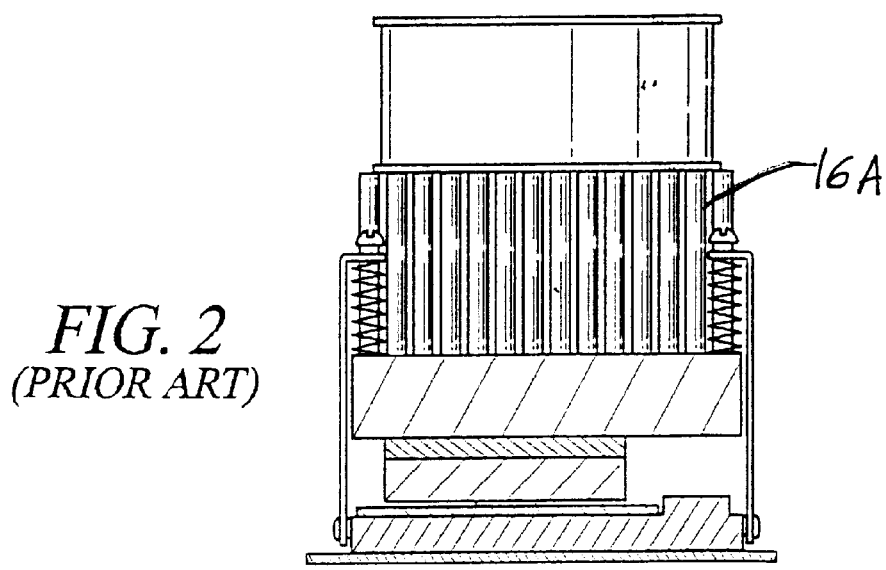
FIG. 2 is a side view of the prior art heat dissipating device shown in FIG. 1.

Advantageously, the threaded turns of the helicoid pins 16, 18 provide an uneven, i.e., rough, cooling surface that facilitates the heat dissipation from the microprocessor 12 as discussed in more detail herein below. As a result of the large number of turns per inch, the helicoid pins 16, 18 have a cooling surface at least twice the cooling surface of a straight pin 16A of the prior art having the same diameter (FIGS. 1, 2).

Heat dissipating device 10 is assembled to a conventional cooling fan 20 to form a heat dissipating unit. See FIG. 3. In the preferred embodiment, cooling fan 20 is positioned at the end of the helicoid or threaded pins, such as 16 (FIG. 3) opposite the heat sink base 14. The cooling fan 20 moves air about the pins 16, 18. The movement of air over the uneven cooling surface of the threaded pins 16, 18 creates a desirable turbulence and facilitates the heat dissipation of the microprocessor 12.

The microprocessor 12 has two sides. On the side opposite the heat sink base 14 there is positioned a layer of grease 22. This layer of grease 22 helps to establish thermal conductivity between the microprocessor 12 and the heat sink base 14 so that the heat generated by the microprocessor 12 is pulled away from the microprocessor 12 and dissipated through the helicoid pins 16, 18. Any suitable grease known in the art may be used, such as silicon or non-silicon compounds, or silver-based compounds.

Microprocessor 12 is fixed to a conventional microprocessor socket 24 in a manner known in the art. Microprocessor socket 24 is fixed to conventional socket base 26 in a manner known in the art.

The heat dissipating unit further comprises a mounting assembly 28. The mounting assembly 28 can take on any shape and form known in the art so long as it sufficiently forces heat sink base 14 toward the microprocessor 12. In one preferred embodiment, the mounting assembly 28 comprises screw or mounting arm 30 having cap 32 at one end. Screw 30 is threadably inserted through a hole in plate 34 and a hole in the heat sink base 14 and fixed at the other end to base 36. Compression spring 38 is positioned about screw 30 and biased so as to apply a force against cap 32 and to consequently force the heat sink base 14 toward the microprocessor 12.

In operation, cooling fan 20 draws fresh air in from the area around the microprocessor 12 and mixes it with heat generated by and emanating from the microprocessor 12. Some of the heat generated by the microprocessor moves up through the layer of grease 22, through the heat sink base 14 and to the helicoid pins 16, 18 extending upwardly therefrom. The heated pins 16, 18 are cooled by the air flow generated by the cooling fan 20 and thus the invention effectively dissipates the heat generated by the microprocessor.

The cooling surface of each straight pin of the prior art 16A, shown in FIGS. 1, 2, is about 0.45 inches. In contrast, the cooling surface of a helicoid pin, such as 16, 18 (FIGS. 3, 4) is about 1.23 inches. Thus, the cooling surface of each helicoid pin 16, 18 of the present invention is at least two and about three times greater than the cooling surface of a straight pin 16A of the prior art (FIGS. 1, 2) having the same diameter. As a result of the increased cooling surface, use of a plurality of helicoid pins, constructed in accordance with the present invention, provides superior heat dissipation when compared to prior art straight pins 16A (FIGS. 1, 2) having the same diameter.

Figure 5:
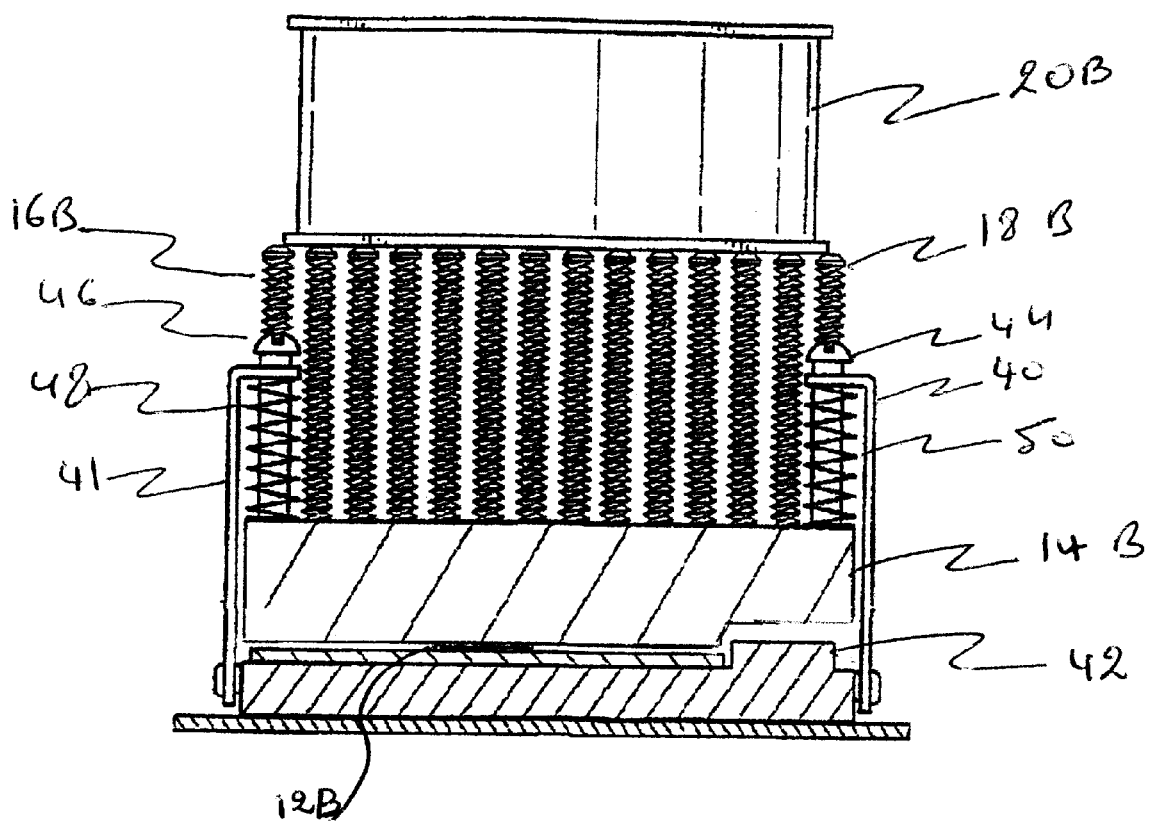
FIG. 5 is a cross-sectional view of another preferred embodiment of a heat dissipating device constructed in accordance with the present invention.

FIG. 5 illustrates another preferred embodiment of the invention, where elements in common with the embodiment shown in FIGS. 3–4 are designated with a "B" suffix. As shown, the combination of helicoid pins 16B, 18B and heat sink base 14B may be adapted for use with various models of microprocessors 12B. Various adaptations may be necessary, without departing from the scope of this invention, such as the use of an alternative mounting assembly. In this preferred embodiment, brackets 40, 41 are connected to base 42 at one end and curve at the other end so that each terminate over heat sink base 14B. Screws 44, 46 are inserted through a hole in brackets 40, 41, respectively, and connect to heat sink base 14B. Compression springs 48, 50 are positioned about screws 46, 44 respectively, and are biased so as to apply a force against the top of screws 46, 44 and consequently force the heat sink base 14B toward the microprocessor 12B.

It should be understood that the foregoing is illustrative and not limiting and that obvious modifications may be made by those skilled in the art without departing from the spirit of the invention. Accordingly, reference should be made primarily to the accompanying claims, rather than the foregoing specification, to determine the scope of the invention.

What is claimed is:

1. A heat dissipating device for cooling an electrical component comprising:
    a heat sink base; and
    a plurality of helicoid pins fixed to the heat sink base and extending therefrom, wherein the plurality of helicoid pins provides an uneven cooling surface that facilitates the heat dissipation of the electrical component,
    wherein at least some of the helicoid pins have a diameter between about 0.05 inches to 0.15 inches,
    wherein at least some of the helicoid pins have 25–35 turns per inch, and
    wherein each of the helicoid pins has a thread depth, wherein at least some of the turns of the helicoid pins have a thread depth between about 0.005 and 0.02 inches.

2. The heat dissipating device of claim 1, wherein the helicoid pins are arranged on the heat sink base so as to be substantially parallel to each other.

3. The heat dissipating device of claim 1, wherein at least some of the helicoid pins have a cooling surface at least twice the cooling surface of a straight pin having the same diameter.

4. A heat dissipating unit for cooling a central processing unit, comprising:
    a heat sink base having two sides;
    a plurality of threaded pins having two ends, one end fixed to one side of the heat sink base, at least some of the threaded pins have a diameter between about 0.05 inches to 0.15 inches, at least some of the threaded pins have 25–35 turns per inch, and each of the threaded pins has a thread depth, wherein at least some of the turns of the threaded pins have a thread depth between about 0.005 and 0.02 inches, wherein the threaded pins provide an uneven cooling surface; and
    a cooling fan positioned at the other end of the threaded pins for moving air about the threaded pins,
    wherein the moving air of the cooling fan over the uneven cooling surface of the threaded pins creates a desirable turbulence and facilitates the heat dissipation of the central processing unit.

5. The heat dissipating unit of claim 4 further comprising a central processing unit positioned on the side of the heat sink base opposite the plurality of threaded pins.

6. The heat dissipating unit of claim 5 further comprising grease between the central processing unit and the heat sink base.

7. The heat dissipating unit of claim 6, the central processing unit having at least two sides, the heat dissipating unit further comprising a mounting assembly, the mounting assembly including:
    a base;
    a mounting arm connected to the base at one end and the heat sink base at the other end; and a compression spring positioned about the mounting arm and biased so as to force the heat sink base toward the central processing unit.

8. The heat dissipating unit of claim 4 wherein the threaded pins are arranged on the heat sink base so as to be substantially parallel to each other.

9. The heat dissipating unit of claim 4, wherein at least some of the threaded pins have a cooling surface at least twice the cooling surface of a straight pin having the same diameter.

10. A heat dissipating device for cooling a central processing unit, comprising:

a heat sink base;

a plurality of helicoid pins having two ends, one fixed to the heat sink base and extending outwardly therefrom, each of the pins having turns thereon, at least some of the helicoid pins having a diameter between about 0.05–0.15 inches, at least some of the pins having about 25–35 turns per inch, at least some of the turns of the helical pins having a thread depth of between about 0.005–0.02 inches, wherein the turns of the helicoid pins provides an uneven cooling surface; and a cooling fan positioned at the other end of the helicoid pins for moving air about the helicoid pins, wherein the moving air of the cooling fan over the uneven cooling surface of the helicoid pins creates a desirable turbulence and facilitates heat dissipation of the central processing unit.

11. The heat dissipating unit of claim 10, the heat sink base having two sides, the plurality of helicoid pins positioned on one side of the heat sink base, the heat dissipating unit further comprising a central processing unit positioned on the side of the heat sink base opposite the plurality of helicoid pins.

12. The heat dissipating unit of claim 11 further comprising grease between the central processing unit and the heat sink base.

13. The heat dissipating unit of claim 12, the central processing unit having two sides, the heat dissipating unit further comprising a mounting assembly, the mounting assembly including:

a mounting base;

a mounting arm connected to the mounting base at one end and the heat sink base at the other end; and a compression spring positioned about the mounting arm and biased so as to force the heat sink base toward the central processing unit.

* * * * *